United States Patent [19]

Nakagawa

[11] 4,328,570

[45] May 4, 1982

[54] ELECTRONIC TIMEPIECE WITH ILLUMINATION LAMP BATTERY VOLTAGE DROP COMPENSATION CIRCUIT

[75] Inventor: Hisahide Nakagawa, Tanashi, Japan

[73] Assignee: Citizen Watch Company Limited, Tokyo, Japan

[21] Appl. No.: 141,719

[22] Filed: Apr. 18, 1980

[30] Foreign Application Priority Data

Apr. 24, 1979 [JP] Japan ........................ 54-49703

[51] Int. Cl.[3] .................. G04B 19/30; G04B 23/02; G04F 5/00; H03B 5/30

[52] U.S. Cl. .................................. 368/67; 368/73; 368/156; 368/204; 331/116 FE; 331/176

[58] Field of Search .................. 368/67, 72, 73, 75, 368/250, 251, 255, 256, 227, 202, 155, 156, 203, 204; 331/36 R, 36 C, 66, 116 R, 116 FE, 177 R, 185, 176

[56] References Cited

U.S. PATENT DOCUMENTS 4,064,468 12/1977 Kumata ........................ 331/185 X
4,091,611 5/1978 Fukuichi ........................ 368/67
4,131,864 12/1978 Kuzumoto et al. .......... 331/116 FE

FOREIGN PATENT DOCUMENTS 54-153068 11/1979 Japan ........................ 368/67

*Primary Examiner*—Vit W. Miska
*Attorney, Agent, or Firm*—Jordan and Hamburg

[57] ABSTRACT

In an electronic timepiece having a quartz crystal controlled standard frequency oscillator and a device which temporarily imposes a heavy load on the battery when activated, means are provided for changing a value of a circuit constant in the oscillator circuit, such as capacitance or resistance, when the load device is activated. This change in circuit constant value serves to decrease the value of the minimum battery supply voltage below which the oscillator circuit ceases to function, thereby ensuring reliable operation of the oscillator circuit when the timepiece battery voltage drops due to current being supplied to the load device.

12 Claims, 12 Drawing Figures

OSCILLATOR CIRCUIT 18
FREQUENCY DIVIDER CIRCUIT 34
VDD
82
64
72
62
Pr
FF11
FF12
FF13
FF14
FF15
FF1
86
68
94
70
74
88
a
84
66
b
c
92
80
78
RC1
76
COMPARATOR
140
141
DATA SETTING MEANS
142
90
P1
146
144
138
136
132
φC
φR
TIMER CIRCUIT
P2
112
P'A
TIMER CIRCUIT
134
130
128
X1
124
17
PB
16
126
X3
122
X2
LAMP DRIVING CIRCUIT 119
POWER-ON RESET CIRCUIT 120

ELECTRONIC TIMEPIECE WITH ILLUMINATION LAMP BATTERY VOLTAGE DROP COMPENSATION CIRCUIT

BACKGROUND OF THE INVENTION

This invention relates to an oscillation compensating circuit for use in an electronic timepiece that includes a device which constitutes a heavy load, such as an illumination lamp or buzzer.

Electronic timepieces ordinarily incorporate such devices as an illumination lamp and buzzer that present a heavy load when activated. The lamp is used to illuminate the liquid crystal display under poor lighting conditions, and the buzzer is employed to provide an audible tone in a timepiece having an alarm function, the buzzer sounding when a preset time has arrived. Activation of the loading device such as the lamp or buzzer draws a level of current which is several thousand times greater than that normally drawn by the timepiece circuitry, and the result is a substantial increase in the voltage drop across the internal resistance of the battery which constitutes the power source of the timepiece. This internal resistance gradually increases with the age of the battery in use and also exhibits an increase at a low operating temperature owing to its temperature dependence. The voltage drop across the internal resistance will therefore assume an even greater magnitude whenever the loading device is activated by an old battery or at a low operating temperature, or both.

A drop in the power source voltage tends to have a greater affect upon the crystal-controlled oscillator circuit of an electronic timepiece than upon its frequency divider and timekeeping circuits, and the battery voltage may in fact drop to such a level that the oscillator ceases to function. This is particularly the case if the loading device is activated when the timepiece battery has aged and the operating temperature is low.

One method which has been previously proposed to overcome this problem has been to supply the oscillator circuit from a booster circuit when the loading device is activated. However, the oscillator circuit can be compensated only if the booster circuit is functioning, and whether this is the case or not depends on its receiving the signal from the oscillator circuit after the signal has been divided down by the frequency divider circuit. In other words, the requisite condition is that the booster is functioning during the activation of the loading device. Thus if the oscillator circuit stops oscillating because the loading device is activated for a prolonged period of time, compensation becomes impossible because the requisite condition no longer holds. The present invention, however, overcomes the foregoing problem through a novel method which is entirely different from that of the prior art.

Specifically, the present invention is directed to an electronic timepiece of the type in which a battery is used to power a crystal-controlled oscillator circuit and a loading device, the oscillator circuit having an inverter and passive elements such as capacitors for effecting oscillation and resistors for limiting current. Use is made of the fact that a decrease in the electrical constants of the passive elements is accompanied by a reduction in the oscillation shut-down voltage of the oscillator circuit, i.e., the minimum value of supply voltage applied to the oscillator circuit which will enable it to sustain oscillation. To this end, the oscillator circuit is provided with selection means operable to change the electrical constants of the passive elements so as to offset the voltage drop described above. The electrical constants are reduced in value by controlling the selection means in conjunction with activation of the loading device. The effect of this reduction is to ensure continued operation of the oscillator circuit by allowing the oscillation shut-down voltage of the oscillator circuit to be lowered whenever the loading device is activated. This ensures that the operation of the oscillator circuit will not be adversely affected by a drop in supply voltage across the internal resistance of the timepiece battery, particularly a very large voltage drop that can be caused by a massive increase in the internal resistance of the battery due to its age or by operation at a low temperature, or a combination of both of these conditions.

SUMMARY OF THE INVENTION

The present invention is applicable to an electronic timepiece equipped with a crystal controlled oscillator circuit for producing a standard high frequency signal and with a device which imposes a temporary heavy load on the timepiece battery when it is activated, such as a dial illumination lamp or an alarm buzzer. The invention comprises means for changing the value of a circuit constant in the oscillator circuit when the load device is activated, the change in circuit constant value being such as to reduce the minimum value of battery voltage below which the oscillator circuit will cease to function. Continued operation of the oscillator circuit is thereby assured, even when the timepiece battery is approaching the end of its usable life, or when the internal resistance of the battery is high due to the ambient operating temperature being excessively low.

DESCRIPTION OF THE PREFERRED EMBODIMENTS

Figure 1:
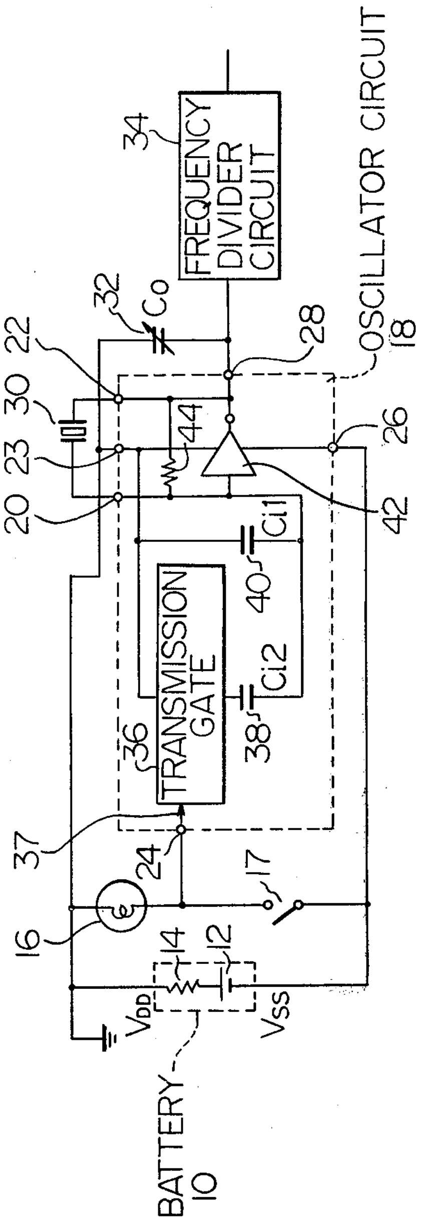
FIG. 1 is a circuit diagram of a first embodiment of a timepiece standard frequency oscillator circuit and illumination lamp circuit constructed according to the present invention.

Referring to the circuit diagram of FIG. 1, a first preferred embodiment of a standard frequency oscillator circuit and an illumination lamp circuit according to the present invention are shown. Reference numeral 10 denotes a battery, which can be represented as composed of a voltage source 12 and an internal resistance 14. An illumination lamp 16 is controlled by the user through an externally actuated switch 17, by being connected across the battery 10 when switch 17 is actuated. Numeral 18 denotes a standard frequency oscillator circuit for producing a standard high frequency signal. The frequency of oscillator circuit 18 is controlled by a crystal vibrator 30. Oscillator circuit 18, which can comprise an integrated circuit chip, has six terminals, denoted by numerals 20, 22, 23, 24, 26 and 28. Crystal vibrator 30 is connected between terminals 20 and 22, which are respectively connected to the input and output terminals of an inverter 42. Oscillator circuit 18 further comprises a bias resistor 44 connected between the input and output terminals of inverter 42, a first input capacitor 40 connected between the input terminal of inverter 42 and the $V_{DD}$ terminal of battery 10, and having a value $C_i1$, and a second input capacitor 38 having a value $C_i2$ connected to the input of inverter 42 and through a transmission gate 36 to the $V_{DD}$ terminal of battery 10, which is the ground potential in this embodiment. An output capacitor 32, having a value $C_O$, is connected at one end to terminal 28 of oscillator circuit 18 to the output of inverter 42, and to its other end to ground potential. Capacitor 32 is a trimmer capacitor, to enable fine adjustment of the operating frequency of oscillator circuit 18. Transmission gate 36 is coupled at a control terminal 37 through terminal 24 to the junction of switch 17 and illumination lamp 16. The output of oscillator circuit 18 is supplied from terminal 28 to a frequency divider circuit 34, which produces a standard frequency unit time signal for timekeeping purposes. Control terminal 37 of transmission gate 36 is connected to the junction of switch 17 and illumination lamp 16, so that transmission gate 36 acts to disconnect one terminal of capacitor 38 from the $V_{DD}$ terminal of battery 10, i.e. from ground potential, when switch 17 is actuated to turn on illumination lamp 16.

The operation of the circuit of FIG. 1 will be explained with reference to the graphs of FIGS. 2A, 2B and 2C. In these graphs, the designation $C_{in}$ refers to the value of input capacitance connected between the input terminal of an inverted in a crystal controlled oscillator circuit and ground. In the circuit of FIG. 1, this value $C_{in}$ has a value $C_i1$ when lamp operating switch 17 is being actuated and has a value $(C_i1+C_i2)$ when switch 17 is not actuated to turn on illumination lamp 16, so that capacitors 38 and 40 are connected in parallel.

Figure 2A:
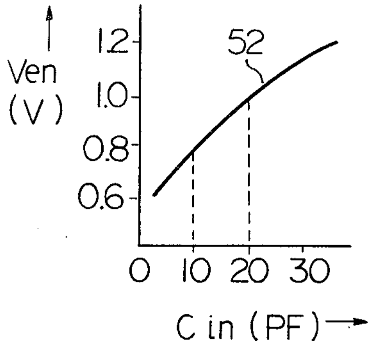
FIGS. 2A, 2B and 2C are graphs illustrating the relationships between a value of input capacitance in the circuit of FIG. 1 and the minimum battery voltage for sustained operation of the oscillator circuit, the current drawn by the oscillator circuit, and the frequency stability of the oscillator circuit, respectively.

Referring first to FIG. 2A, the minimum value of supply voltage applied to a crystal oscillator circuit which will enable sustained oscillation is designated as Ven. This supply voltage value will be abbreviated hereinafter to the "oscillation shut-down voltage". FIG. 2A shows the variation of this shut-down voltage value with changes in the value of input capacitance $C_{in}$, as a curve 52. As can be seen, the oscillation shut-down voltage value increases as the value of input capacitance $C_{in}$ is increased, in an approximately proportional manner.

Figure 2B:
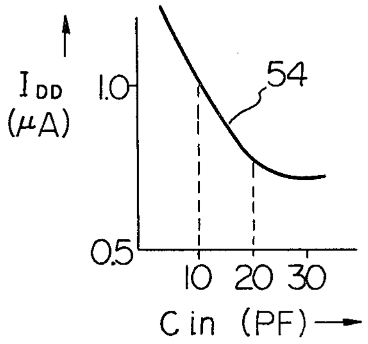

FIG. 2B shows the relationship between the current which is drawn by a crystal controlled oscillator circuit such as that of FIG. 1, designated as $I_{DD}$, and the value of input capacitance $C_{in}$. As shown, the level of current drawn is high when the value of input capacitance is below a certain range, and approaches a minimum value in another, higher range of input capacitance values which may be of the order of 20 to 30 picofarads as in the example of FIG. 2B. It can thus be seen that the values of input capacitance $C_{in}$ which provide a low value of current drawn by the oscillator circuit are incompatible with the requirements for a low value of oscillator shut-down voltage Ven.

Figure 2C:
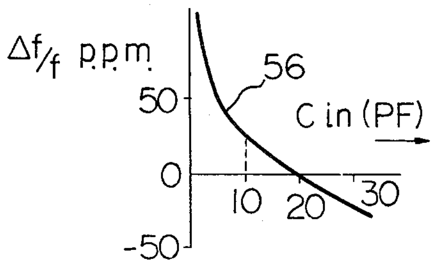

FIG. 2C shows the relationship between the frequency drift of a crystal controlled oscillator circuit denoted as $\Delta f/f$, to a scale of parts per million (ppm) and the value of input capacitance $C_{in}$. As illustrated, the value of input capacitance with provides minimum frequency drift is of the same order as the value of input capacitance which provides minimum supply current drawn by the oscillator circuit, i.e. about 20 picofarads in the example of FIG. 2C.

Thus, is indicated by FIGS. 2B and 2C, it is possible to establish a value of input capacitance $C_{in}$ for which the level of frequency drift $\Delta f/f$ is aproximately zero and for which the level of current drawn by the oscillator circuit is close to a minimum. In the examples of FIGS. 2B and 2C, this optimum value of input capacitance is assumed to be 20 picofarads. However, with this value of input capacitance, as shown by FIG. 2A, this value of input capacitance results in the value of Ven being relatively high. Thus, there is a possibility that, if the internal resistance of the timepiece battery is relatively high, due to battery age or to low operating temperature, the oscillator circuit will cease operation, when a large current is drawn from the battery by actuation of illumination lamp 16. However, as shown in FIG. 2A, if the value of input capacitance is reduced to, for example, 10 picofarads while the illumination lamp 16 is being activated, then the level of oscillator shut-down voltage Ven is lowered substantially, so that the possibility of the oscillator circuit ceasing to function is greatly reduced.

It can thus be seen that a crystal controlled oscillator circuit according to the present invention, as shown in FIG. 1, can be provided with an optimum value of input capacitance by setting input capacitor $C_i1$ to a value (such as for example 10 picofarads) and capacitor 38 to a value (such as 10 picofarads) such that the parallel combination of capacitors 38 and 40 provides a value (i.e. 20 picofarads) which gives minimum frequency drift and approximately minimum current consumption by the oscillator circuit. When switch 17 is actuated, to turn on illuminating lamp 16, then transmission gate 36 acts to disconnect capacitor 38 from the input circuit of oscillator circuit 18, so that the input capacitance value becomes much lower (i.e. 10 picofarads). This ensures that the voltage drop across internal resistance 14 of battery 10 does not cause cessation of operation of oscillator circuit 18, since the oscillator shut-down voltage level Ven is thereby lowered, as indicated in FIG. 2A.

While lamp operating switch 17 is being actuated, the current consumption of the oscillator circuit 18 and the level of frequency drift will be increased, as indicated by FIGS. 2B and 2C. However, since lamp operating switch 17 will generally only be operated occasionally, and for a duration of the order of a few seconds or less, this change in current consumption and frequency drift will not normally be a significant factor in the operation of the timepiece. However, if it is desired to remove any possibility that the change in frequency drift of the oscillator circuit may affect timekeeping accuracy, then it is possible to modify the division ratio of frequency divider circuit 34 when lamp operating switch 17 is actuated, as will be described with reference to the second embodiment of the present invention shown in FIG. 3.

Figure 3:
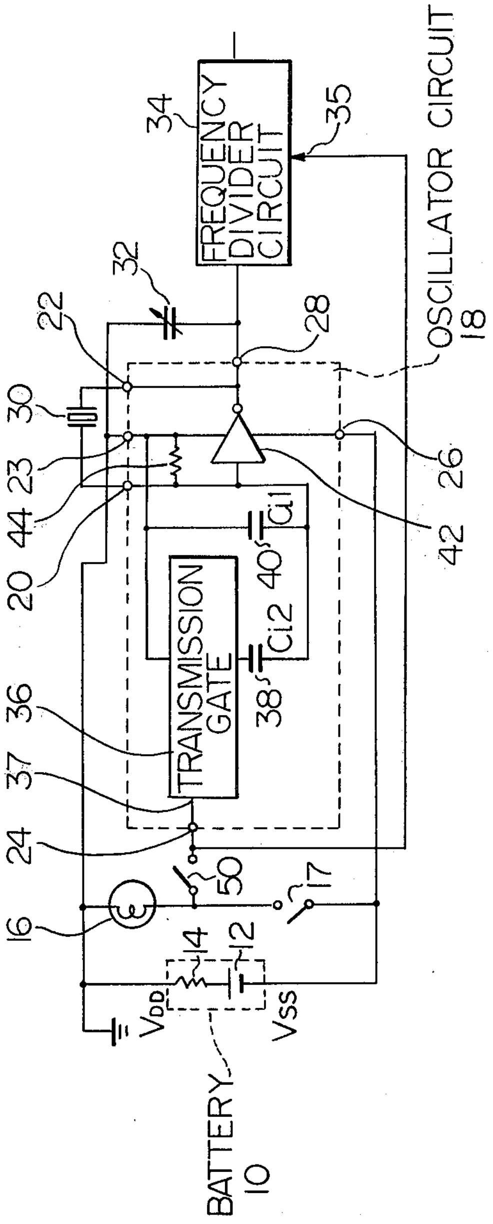
FIG. 3 is a circuit diagram of a second embodiment of a timepiece standard frequency oscillator circuit and an illumination lamp circuit according to the present invention, being a modification of the embodiment of FIG. 1.

The circuit of FIG. 3 is essentially similar to that of FIG. 1, but is arranged such that actuation of transmission gate 36 to disconnect input capacitor 38 is only performed when the ambient operating temperature is below a predetermined value, and is further arranged such that the division ratio of frequency divider circuit 34 is modified slightly while switch 17 is being actuated to turn on illumination lamp 16, as described in the preceding paragraph. Numeral 50 denotes a temperature sensitive switch, which operates when the ambient operating temperature falls below a predetermined level to connect the control terminal 37 of transmission gate 36 to the junction of lamp operating switch 17 and illumination lamp 16. Use of such a temperature sensitive switch may be desirable, since a very large increase in the value of internal resistance 14 of battery 10 occurs at low temperatures, even in the case of a relatively fresh battery. At temperatures above this predetermined level, the transmission gate 36 will not be actuated when lamp operating switch 17 is actuated.

As shown in FIG. 3, a connection is made between the input control terminal of transmission gate 36 and a control input terminal 35 of frequency divider 34. Control input teminal 35 is coupled to circuitry which modifies the division ratio of frequency divider 34 slightly when both lamp operating switch 17 and temperature sensitive switch 50 are closed. This change in division ratio serves to compensate for a change in frequency of operation of oscillator circuit 18 due to a change in the value of input capacitance thereof from the parallel combination of capacitors 38 and 40 to a single capacitor 40 when switches 17 and 50 are both in the closed condition, as indicated in FIG. 2C. The change in frequency division ratio would be such as to cause a slight increase in the division ratio of frequency divider 34, for the case illustrated in FIG. 2C. Methods of producing such a change in frequency division are well known in the art, and will therefore not be described here in detail. Such methods include, for example, the use of an inhibit gate which periodically acts to inhibit pulses from being transferred through frequency divider 34.

In this way, even if illuminating lamp 16 is utilized frequently, there will be no cumulative effect of variations in the frequency of oscillator circuit 18 upon the timekeeping accuracy of the electronic timepiece, since such frequency variations will be negated by the input applied from lamp control switch 17, through temperature sensitive switch 50 to the control input of frequency divider circuit 34.

It should be noted that it is equally possible to utilize such a method of altering the division ratio of frequency divider 34 in the case of an embodiment of the present invention which does not use a temperature sensitive switch, such as the embodiment of FIG. 1. In this case, as in the embodiment of FIG. 3, a connection would be made between the junction of switch 17 and illuminating lamp 16 and a control input terminal of frequency divider 34.

Figures 4, 4A, 4B:
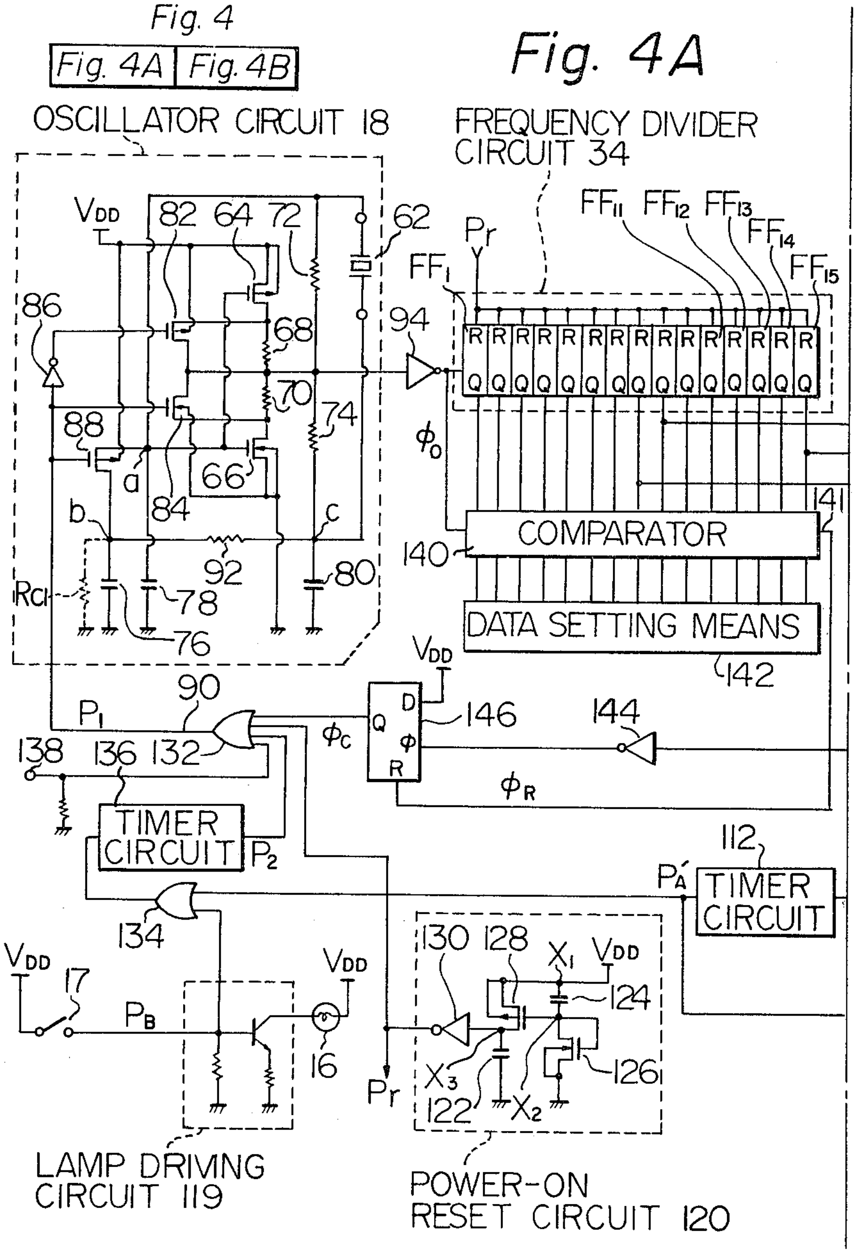
FIG. 4 is a simplified circuit diagram of an embodiment of an electronic timepiece incorporating the present invention.
Figure 4B:
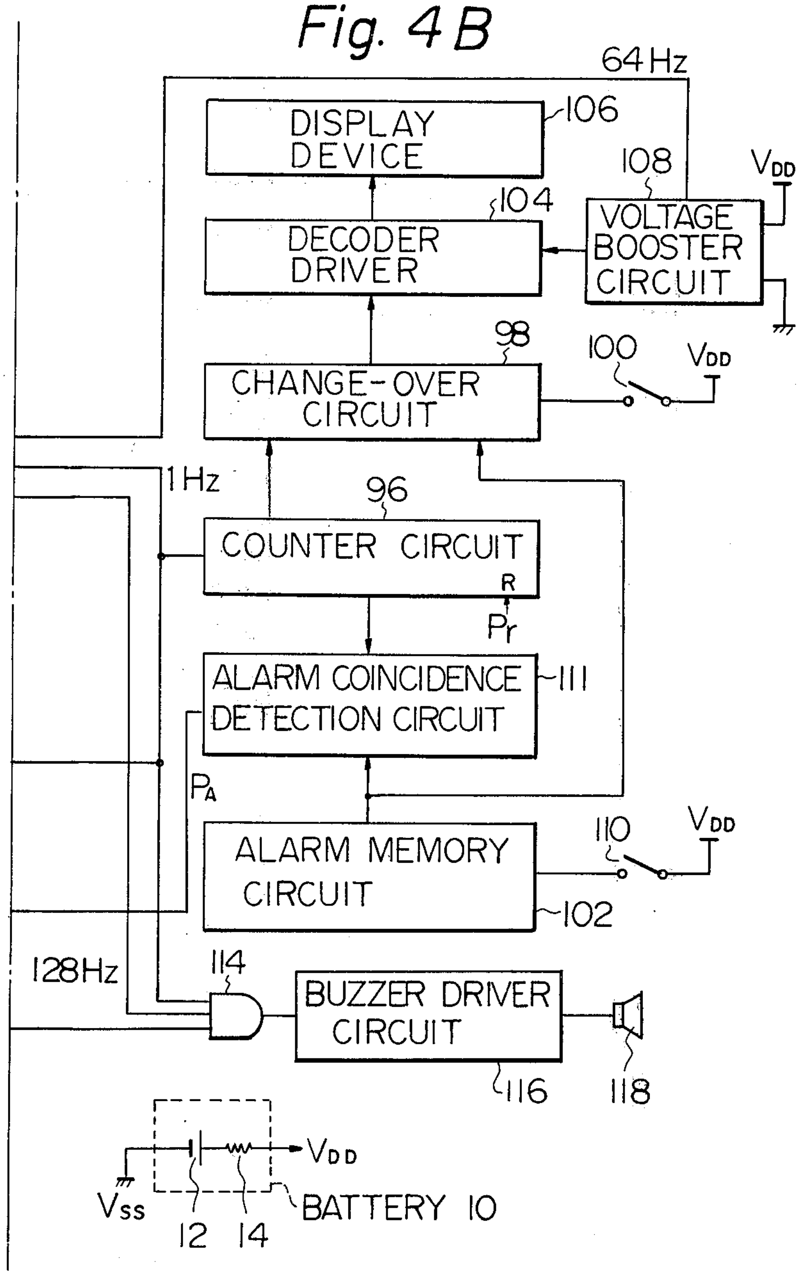

FIG. 4 is a simplified circuit diagram of another embodiment of the present invention, comprising an electronic timepiece circuit which utilizes an oscillator circuit according to the present invention. Reference numeral 10 denotes a battery, shown as being composed of a voltage source 12 and an internal resistance 14. Reference numeral 18 denotes a basic crystal-controlled oscillator circuit which can comprise a crystal vibrator 62, a complementary type inverter composed of a P-channel MOS transistor 64, an N-channel MOS transistor 66 and current limiting resistors 68, 70 connected in series between the drain of transistor 64 and the drain of transistor 66, a bias resistor 72 which decides the operating point of the complementary inverter, a stabilizing resistor 74 for improving the voltage-frequency characteristic of the crystal-controlled oscillator circuit, input capacitors 76, 78, each having a capacitance of 10 picofarads, and an output capacitor 80, having a capacitance of 20 picofarads. The crystal-controlled oscillator circuit 18 is provided with first and second selection means for varying, in a compensatory manner, the capacitors 76, 78 and resistors 68, 70 constituting the passive elements.

Specifically, the first selection means is composed of a P-channel MOS transistor 82 connected in parallel with the current limiting resistor 68 having a value of 150 kilohms, an N-channel MOS transistor 84 connected in parallel with the current limiting resistor 70 also having a value of 150 kilohms, and an inverter 86. Transistors 82, 84 are selectively controlled in such a manner that they are turned off by the action of the inverter 86 and a control signal $P_1$ which enters on line 90 at a low logic level during normal operation. External confirmation of the values of resistors 68, 70 at this time would reveal values of 150 kilohms for each one. If a loading device to be described later is now activated, the control signal on line 90 goes to a high logic level, thereby turning on the transistors 82, 84. This establishes a short circuit between the ends of each current limiting resistor 68, 70, and external confirmation of the resistance values (the electric circuit constants) shows that the values are reduced in an equivalent manner.

The second selection means is constructed by coupling a P-channel MOS transistor 88, connected in series with the input capacitor 76, to the connection point a of the input capacitor 78. Transistor 88 is selectively controlled in such a manner than the transistor is turned on by the control signal $P_1$ which enters on line 90 at a low logic level during normal operation. Transistor 88, when controlled in this manner, connects the capacitors 76, 78 in parallel to provide a total input capacitance $C_{in}$ of $C_1+C_2$, that is, $C_{in}=C_1+C_2$, where $C_1$ and $C_2$ are the capacitances of capacitors 76 and 78 respectively. If the loading device is not activated, the control signal $P_1$ goes to the high logic level, thereby turning off the transistor 88 so that the total input capacitance now becomes $C_2$, this representing a total input capacitance (electric circuit constant) which is obviously less than the total input capacitance $C_{in}=C_1+C_2$ during normal operation. Designated at 92 is a resistor connected between connection points b and c in order to apply a biasing voltage. More specifically, the charge stored in input capacitor 76 self-discharges through its own leakage current path (indicated by the dotted line $R_{C1}$) during the period of time that transistor 88 is not conducting. Hence the resistor 92 is provided in order to prevent any fluctuation in the DC potential at point a when transistor 88 is conducting.

Numeral 94 denotes an inverter which receives the standard high frequency signal from the crystal-controlled oscillator circuit 18. The inverter output signal is applied to a frequency divider circuit 34 which consists of 15 cascade-connected frequency dividers $FF_1$ to $FF_{15}$ that divide the high frequency signal down to a 1 Hz standard time signal which is then coupled to a counter circuit 96 composed of a seconds counter, minutes counter and hours counter, etc. A change-over circuit designated at numeral 98 responds to operation of a switch 100 to select either the count which has accumulated in the counter circuit 96 or the content which has been stored in an alarm time memory circuit 102 to be subsequently described, the selected information being delivered to a decoder driver 104. The latter converts this information into a code signal suitable for display, the signal driving a display device 106. The display device 106 comprises a liquid crystal cell adapted to display such time information as hours, minutes and seconds, as well as information indicative of the present alarm time. A voltage booster circuit 108 receives a 64 Hz signal provided by the frequency divider circuit 34 and boosts the voltage supplied by battery 10 up to a level sufficient for driving the display device 106. This boosted voltage is supplied to the decoder driver 104 as shown in the drawing.

Reference numeral 102 denotes an alarm memory circuit which responds to the operation of an alarm time setting switch 110 to store the set alarm time. An alarm coincidence detection circuit 111 compares the count accumulated in counter circuit 96 with the content of memory circuit 102 and produces an alarm coincidence signal $P_A$ of a high logic level when both of the aforementioned inputs are in coincidence. The alarm coincidence signal $P_A$ is coupled to a timer circuit 112 which issues a high level pulse $P_A'$ of a prescribed duration, namely 20 seconds in the present embodiment, after the signal $P_A$ has gone high. An AND gate 114 receives a 128 Hz signal and the 1 Hz signal from the frequency divider circuit 34 as well as the signal $P_A'$ from timer circuit 112, and is adapted to supply its output signal to a buzzer drive circuit 116 thereby to drive a buzzer 118.

17 is a lamp activating switch which, when depressed, sends a high level signal $P_B$ to a lamp driving circuit 119 which responds by activating a lamp 16 that illuminates the display device 106.

Figure 7:
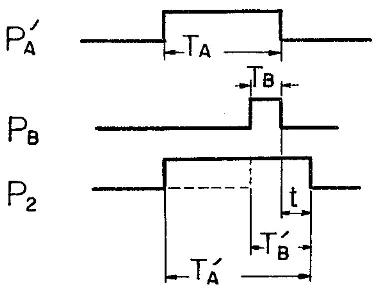
FIG. 7 is a waveform diagram illustrating the operation of a timer circuit in the embodiment of FIG. 4.

Reference numeral 120 designates a power-on reset circuit which issues an output pulse $P_r$ when the battery 10 is connected into the circuitry. The power-on reset circuit 120 is formed by connecting capacitors 122, 124 in series between the drains of an N-channel insulated gate-type transistor 126 and a P-channel insulated gate-type transistor 128. The transistor 126 and capacitor 124 construct a differentiation circuit, and transistor 128 and capacitor 122 an integration circuit. The output of the integration circuit is coupled to an inverter 130. Thus when the battery 10 is connected, a voltage at a high logic level, namely $V_{DD}$, is applied at point $X_1$, whereupon a differentiated signal appears at point $X_2$. The P-channel insulated gate-type transistor 128 is rendered conductive when the differentiated signal attains the threshold voltage $V_{IP}$ of the transistor, whereby an integrated signal appears at point $X_3$. The inverter 130 will output the pulse $P_r$, serving as a reset pulse, when the integrated signal reaches the inverter threshold voltage $V_{TH}$. The circuitry is constructed such that the pulse $P_r$ will be supplied to each stage of frequency divider circuit 34, the reset terminal R of the counter circuit 96, and to an input of an OR gate 132. An OR gate 134 receives the signals $P_A'$, $P_B$ and delivers its output signal to a timer circuit 136. The timer circuit 136, as will be understood from FIG. 7, produces a signal $P_2$ that goes high for an interval $T_A'$ or $T_B'$ that includes a prescribed interval t sufficient for allowing the battery supply voltage to be restored to the normal level after the battery 10 has experienced a voltage drop due to driving a loading device, such as lamp 16, or a buzzer. The signal $P_2$ goes high as soon as the signal $P_A'$ or $P_B$ goes high, indicating the driving of a loading device, and remains high for the load driving interval $T_A$ or $T_B$ as well as for the abovesaid prescribed interval t which immediately follows each load driving interval. With the timer circuit 136 of this embodiment, the prescribed interval t is set to 5 seconds.

Reference numeral 138 denotes a test terminal which is connected to the input side of OR gate 132, 140 a comparator, 142 designates data setting means, 144 an inverter and 146 a data-type flip-flop. Moreover, the comparator 140 and the data setting means 142 may be of the type shown in British Pat. No. 1,488,690 which shows in FIG. $3_I$ a control circuit (13*b*) comprising a frequency regulation means (13) and a clock pulse forming circuit (33), and an operating part (13*a*). The comparator 140 and frequency divider circuit 34 receive a signal $\phi_o$ which is the high frequency output of oscillator circuit 18 after inversion by the inverter 94. The input terminals of comparator 140 are coupled to frequency divider circuit 34 and data setting means 142, and its coincidence output terminal 141 to the reset terminal R of the data-type flip-flop 146. Flip-flop 146 has an output terminal Q which is coupled to the control input terminal of OR gate 132, a data input terminal D which is connected to the high voltage terminal $V_{DD}$ of the battery, and a clock input terminal $\phi$ which receives the 1 Hz signal from frequency divider circuit 34 after inversion by the inverter 144.

Figure 5:
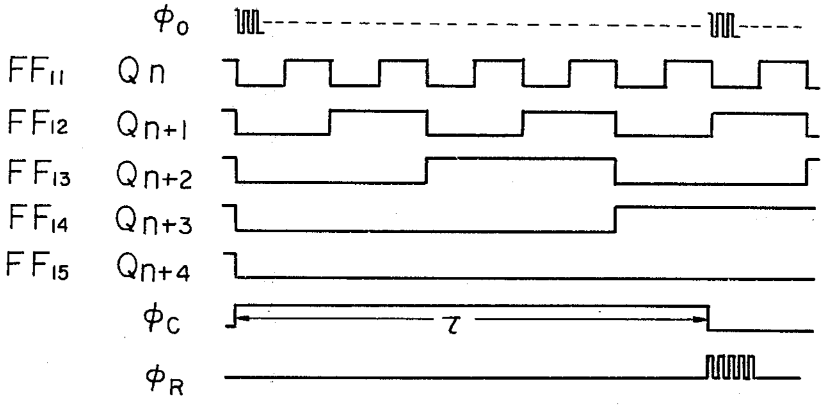
FIGS. 5 an 6 are waveform diagrams to illustrate the operation of the embodiment of FIG. 4.

Illustrated in FIG. 5 are waveforms for a case in which five bits of data are subjected to a comparison by the comparator 140, the waveforms representing the respective bits. When the output $Q_{n+4}$ of $FF_{15}$, namely the fifth bit or 1 Hz signal from frequency divider circuit 34, goes from the high logic level to the low logic level, flip-flop 146 immediately performs a data read-in operation and its output $\phi_c$ goes high. OR gate 132 responds by delivering a low logic level output to the oscillator circuit 18, thereby turning on transistors 82, 84 and turning off transistors 88. Thereafter, counting of the 1 Hz signal from frequency divider circuit 34 continues, and the content of the frequency divider circuit eventually comes into coincidence with the content (01010 in this embodiment) of the data setting means 142. When this occurs the output $\phi_R$ of comparator 140 goes high to reset flip-flop 146 whose output $\phi_c$ goes low, thereby turning off transistors 82, 84 and turning on transistor 88. In this case, one period (one second) of the $Q_{n+4}$ output of FF15 corresponds to $T_o$, while the time interval at which the output $\phi_c$ of flip-flop 146 is held at the high level corresponds to $\tau$. The value of $\tau/T_o$ may be varied over a range of approximately 0 to 1, and it is obvious that this can be accomplished by changing the frequency divider output terminal that determines $T_o$. In so far as the oscillator circuit 18 is regulated in frequency by changing the value $\tau/T_o$, $T_o$ is not fixed in a strict sense, but can be considered as being so in a broad sense. It should also be noted that while the clock $\phi_o$ applied to comparator 140 is employed as a timing signal to prevent erroneous operation of the comparator, it is not necessarily required that the output signal $\phi_o$ of inverter 94 be used for this purpose. Further, the data setting means 142 may comprise means for setting high and low logic levels mechanically, a READ ONLY memory or a non-volatile memory.

Figure 6:
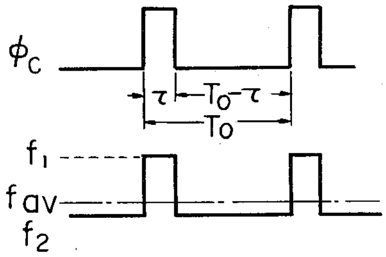

In accordance with the foregoing, the signal $P_1$ from OR gate 132 goes high when the signal $\phi_c$ goes high, turning off transistor 88. This makes the capacitance $C_{in}$ at the point a equal to $C_2$ and establishes an oscillator frequency of $f_1$. When $\phi_c$ goes low, signal $P_1$ goes low and turns on transistor 88, making the capacitance $C_{in}$ at point a equal to $C_1+C_2$ and establishing an oscillator frequency of $f_2$, where $f_2<f_1$. Thus, as shown in FIG. 6, if the control signal $\phi_c$ is caused to go high only for a time $\tau$ during the unit time $T_o$, the average value $f_{av}$ of the output frequency delivered by oscillator circuit 18 during the unit time $T_o$ will be given by $$f_{av} = \tau \cdot f_1 + \frac{(T_0 - \tau)}{T_0} = f_2 + \frac{\tau}{T_0}(f_1 - f_2).$$

If the values of the capacitors $C_1$ and $C_2$ are suitably chosen, then it may be understood that the average frequency $f_{av}$ can be regulated by presetting the data setting means 142 so as to vary the value of $\tau/T_o$. In this instance the value to be changed can be either $\tau$ or $T_o$ or both.

Figure 8:
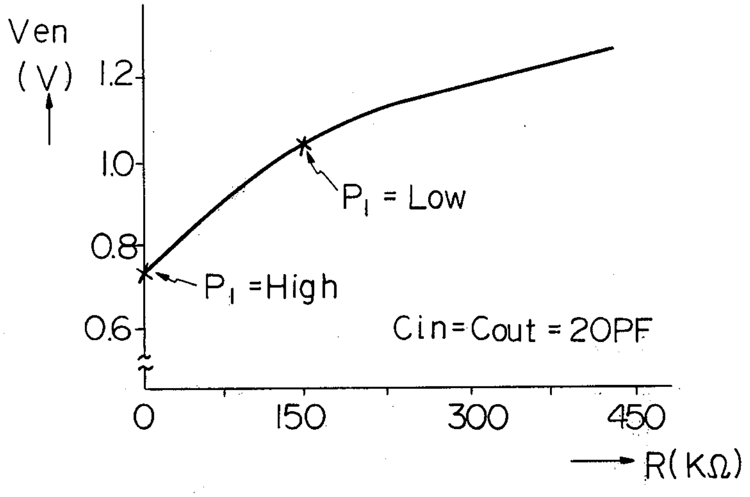
FIGS. 8, 9 and 10 are graphs illustrating the characteristics of the oscillator circuit of the embodiment of FIG. 4 with respect to shut-down voltage Ven.

Signals $P_2$ and $P_1$ go high for the duration $T_B$ in accordance with the operation of the timer circuit 136 when a loading device such as the buzzer 118 or lamp 16 is activated. This makes the oscillator circuit input capacitance $C_{in}$ equal to $C_2$ and causes the oscillator circuit 18 to oscillate at the frequency $f_1$. During normal operation when neither the buzzer nor lamp is activated and the signal $\phi_c$ is low, signal $P_1$ is low and transistor 88 is conducting, making the capacitance $C_{in}$ at point a equal to $C_1+C_2$. This causes the oscillator circuit 18 to oscillate at the frequency $f_2$. The relationship between the value of the input capacitance $C_{in}$ and the oscillation shut-down voltage of the oscillator circuit 18 is shown in FIG. 8, where the capacitance $C_{out}$ is taken as 20 picofarads. FIG. 8 shows that when the input capacitance $C_{in}$ is selected to be small ($P_1$ high), the oscillation shut-down voltage $V_{en}$ is reduced by a wide margin in comparison with its value when $P_1$ is low. It is therefore possible to avoid the worst case wherein oscillator circuit 18 ceases operation because of a drop in the battery voltage caused when a loading device is activated. In other words, it can be seen that compensation is applied to prevent the oscillator circuit 18 from shutting down when a loading device is activated, this compensation being effected by selectively controlling the input capacitance $C_{in}$ of the oscillator circuit to make the value of this capacitance either $C_2$ or $C_1+C_2$ depending upon whether or not a loading device is operating.

Figure 9:
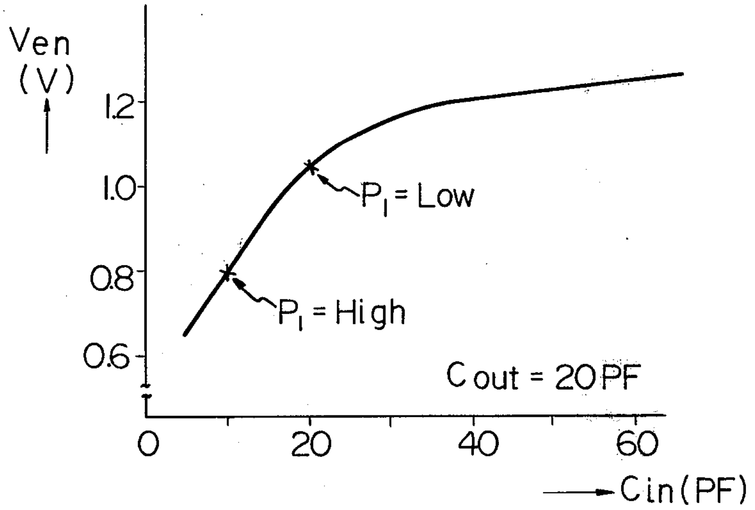

Illustrated in FIG. 9 is the relationship between the output capacitance $C_{out}$ and the oscillation shut-down voltage $V_{en}$, where the value of the input capacitance is taken as 20 picofarads. FIG. 9 shows that the degree of change in the capacitance $C_{out}$ is smaller than that which results from a change in the capacitance $C_{in}$ as depicted in FIG. 8. From this it can be understood that it is far more effective to compensate the oscillator circuit 18 during the driving of the load by varying the value of $C_{in}$, as in the present embodiment, than by varying the value of $C_{out}$.

Figure 10:
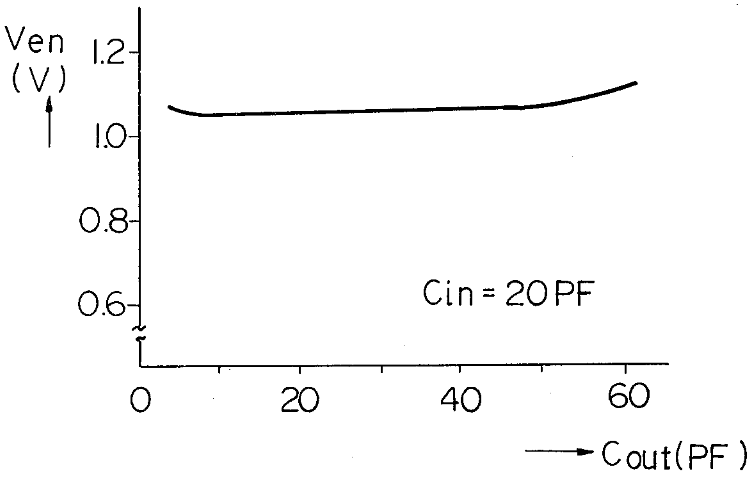

Shown in FIG. 10 is the relationship between the value of the current limiting resistors 68, 70 in the oscillator circuit 12 and the oscillation shut-down voltage $V_{en}$. This graph shows that the oscillation shut-down voltage $V_{en}$ when the signal $P_1$ is high, namely when the values of resistors 68, 70 have been decreased equivalently by being shunted via transistors 82, 84 when they are conducting, has a smaller value than when signal $P_2$ is low and the transistors 82, 84 are not conducting, at which time each resistor 68, 70 exhibits a resistance value of 150 kilohms. It is therefore possible to compensate the oscillator circuit 18 and prevent it from shutting down due to a drop in battery voltage when driving a loading device, by effecting selective control so as to reduce the values of resistors 68, 70 whenever the loading device such as the buzzer 118 or lamp 16 is activated.

The power-on reset circuit 120 is operable to reset the frequency divider circuit 34 and counter circuit 96 by supplying the pulse $P_r$ whenever battery 10 is connected, and is further adapted to facilitate the starting of the oscillator circuit 18 by delivering the pulse $P_r$ to the oscillator circuit through the OR gate 132 to reduce the circuit constants, i.e., the values of resistors 68, 70 and capacitance $C_{in}$.

From the above description it will be apparent that the present invention selectively controls an oscillator circuit in such a manner as to lower its oscillation shut-down voltage when a loading device is activated, thereby making it possible to avoid the situation encountered in the prior art wherein the oscillator circuit may cease operating when the voltage of the power supply battery drops below the oscillation shut-down voltage owing to activation of the loading device. Moreover, the construction of the oscillator circuit can be simplified because the transistor which controls the capacitance $C_{in}$ can be used not only for reducing the oscillation shut-down voltage when activating a loading device but also for selectively controlling the capacitance $C_{in}$ to obtain a desired average frequency of the oscillator circuit output signal.

What is claimed is:

1. In an electronic timepiece powered by a battery and including a load device which places a relatively heavy load on said battery when activated, and activation means for activating said load device, said electronic timepiece further including a crystal-controlled oscillator circuit comprising an inverter having an input electrode and an output electrode, a crystal vibrator connected between said input and output electrodes, input capacitor means coupled between said input terminal and a ground reference potential for thereby determining a value of input capacitance of said crystal-controlled oscillator circuit, and output capacitance means coupled between said output electrode and said ground reference potential for thereby determining a value of output capacitance of said crystal-controlled oscillator circuit, the improvement whereby said input capacitor means comprises a first capacitor and a second capacitor, and further comprising selection means comprising electronic switching means connected in series with said second capacitor such that said value of input capacitance is equal to the sum of the capacitances of said first and second capacitors when said load device is not activated and is equal to the capacitance of said first capacitor when said load device is activated.

2. The improvement according to claim 1, in which said electronic switching means comprises a transmission gate having a control terminal coupled to said activation means of said load device.

3. The improvement according to claim 1, in which said electronic switching means comprises a field effect transistor having a gate terminal coupled to said activation means of said load device.

4. The improvement according to claim 1, in which said load device comprises an illumination lamp.

5. The improvement according to claim 1, in which said load device comprises an alarm buzzer.

6. The improvement according to claim 1, in which said inverter comprises a complementary MOS inverter including a P-channel field effect transistor and an N-channel field effect transistor, and further comprising first and second current limiting resistors connected in series between a drain electrode of said P-channel field effect transistor and a drain electrode of said N-channel field effect transistor, said P-channel field effect transistor having a source electrode coupled to a first potential of said battery and said N-channel field effect transistor having a source electrode coupled to a second potential of said battery, and moreover comprising a first electronic switch coupled in parallel with said first current limiting resistor and a second electronic switch coupled in parallel with said second current limiting resistor, said first and second electronic switches being responsive to said activation means for attaining an opened condition while said load device is activated, and for attaining a closed condition when said load device is not activated.

7. The improvement according to claim 6, in which said first electronic switch comprises a P-channel field effect transistor and said second electronic switch comprises an N-channel field effect transistor.

8. The improvement according to claim 1, in which said activation means produces a control signal while said load device is activated, and in which said electronic switching means comprises a transmission gate having a control terminal coupled to receive said control signal.

9. The improvement according to claim 1, in which said activation means produces a control signal while said load device is activated, and in which said electronic switching means comprises a field effect transistor having a gate electrode coupled to receive said control signal.

10. The improvement according to claim 1, in which said electronic switching means comprising said selection means includes a control terminal, and further comprising timer means coupled between said activation means and said electronic switching means, said timer means being responsive to activation of said load device by said activation means for producing a control signal of predetermined duration, said control signal being coupled to said control terminal of said electronic switching means.

11. In an electronic timepiece powered by a battery and including a load device which places a relatively heavy load on said battery when activated, and activation means for activating said load device, said electronic timepiece further including a crystal-controlled oscillator circuit comprising an inverter having an input electrode and an output electrode, a crystal vibrator connected between said input and output electrodes, input capacitor means coupled between said input terminal and a ground reference potential for thereby defining a value of input capacitance of said crystal-controlled oscillator circuit, and output capacitor means coupled between said output electrode and said ground reference potential for thereby defining a value of output capacitance of said crystal-controlled oscillator circuit, the improvement comprising selection means which comprise electronic switch means coupled to said input capacitor means and responsive to said activation means for reducing said value of input capacitance when said load device is activated, and temperature sensitive switch means coupled in series between said activation means and said electronic switch means, said temperature sensitive switch means being arranged to be closed in response to a predetermined level of the ambient operating temperature, whereby said selection means reduces said value of input capacitance when said load device is activated while said temperature sensitive switch means is in the closed condition.

12. An electronic timepiece powered by a battery, comprising:

a load device which places a relatively heavy load on said battery when activated;

activation means for activating said load device and for producing an output signal indicative thereof;

a crystal-controlled oscillator circuit for producing a relatively high frequency output signal, and comprising a complementary MOS inverter having input and output electrodes, a crystal vibrator element coupled between said input and output electrodes, an output capacitor coupled between said output electrode and a reference ground potential, a first input capacitor coupled between said input electrode and said reference potential, and a second input capacitor having a first terminal thereof coupled to a terminal of said first input capacitor;

electronic switching means having a control electrode and coupled in series with said second input capacitor;

a frequency divider circuit for performing frequency division of said output signal from said crystal-controlled oscillator circuit, to thereby produce a unit time signal;

counter circuit means for counting said unit time signal to thereby provide time information signals;

display means responsive to said time information signals for displaying time information;

data setting means for storing in digital form a numeric value designating a time-sharing ratio of a first oscillation condition of said crystal-controlled oscillator circuit in which said output signal thereof attains a first predetermined frequency and a second oscillation condition in which said output signal thereof attains a second predetermined frequency;

comparator circuit means for comparing at least a portion of the contents of said frequency divider circuit with said numeric value stored in said data setting means and for producing an output signal when coincidence occurs therebetween;

control circuit means responsive to said output signal from said comparator circuit means and to said unit time signal for producing a control signal periodically switched between first and second logic level potentials with a duty cycle determined by said numeric value stored in said data setting means, said control signal being applied to said control electrode of said electronic switching means, said electronic switching means being responsive thereto for setting said second input capacitor in parallel with said first input capacitor while said control signal is at said first logic level potential, to thereby establish said first oscillation condition of said crystal-controlled oscillator circuit and for interrupting said parallel connection condition while said control signal is at said second logic level potential, to thereby establish said second oscillation condition of said crystal-controlled oscillator circuit, whereby an average frequency of oscillation of said output signal from said crystal-controlled oscillator circuit is determined by said numeric value stored in said data setting means;

said control electrode of said electronic switching means being further coupled to receive said output signal from said activation means, and being responsive thereto for interrupting said parallel connection state of said first and second input capacitors, to thereby establish said second oscillation condition of said crystal-controlled oscillator circuit while said load device is activated.

* * * * *